United States Patent
Carducci et al.

(10) Patent No.: US 11,564,292 B2
(45) Date of Patent: Jan. 24, 2023

(54) MONOLITHIC MODULAR MICROWAVE SOURCE WITH INTEGRATED TEMPERATURE CONTROL

(71) Applicant: Applied Materials, Inc., Santa Clara, CA (US)

(72) Inventors: James Carducci, Sunnyvale, CA (US); Richard C. Fovell, San Jose, CA (US); Larry D. Elizaga, Tracy, CA (US); Silverst Rodrigues, Bangalore (IN); Thai Cheng Chua, Cupertino, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 550 days.

(21) Appl. No.: 16/586,548

(22) Filed: Sep. 27, 2019

(65) Prior Publication Data

US 2021/0100076 A1    Apr. 1, 2021

(51) Int. Cl.
    *H05B 6/64*    (2006.01)
    *H05B 6/80*    (2006.01)

(52) U.S. Cl.
    CPC .......... *H05B 6/645* (2013.01); *H05B 6/6402* (2013.01); *H05B 6/806* (2013.01); *H05B 2206/04* (2013.01)

(58) Field of Classification Search
    CPC ........ H01J 29/702; H01J 29/826; H01J 29/76; H05B 2206/04; H05B 6/6402; H05B 6/645; H05B 6/686; H05B 6/806
    (Continued)

(56) References Cited

U.S. PATENT DOCUMENTS 6,072,147 A  *  6/2000  Koshiishi .......... H01J 37/32174
                                                      216/68
2010/0065214 A1    3/2010  Kennedy et al.
(Continued)

FOREIGN PATENT DOCUMENTS

JP    2004524677 A    8/2004
KR    101246191 B1    3/2013
(Continued)

OTHER PUBLICATIONS

International Search Report and Written Opinion of the International Searching Authority for PCT/US2020/050992, dated Dec. 24, 2020, 11 pgs.
(Continued)

*Primary Examiner* — Quang T Van
(74) *Attorney, Agent, or Firm* — Schwabe, Williamson & Wyatt, P.C.

(57) ABSTRACT

Embodiments disclosed herein include a housing for a source assembly. In an embodiment, the housing comprises a conductive body with a first surface and a second surface opposite from the first surface, and a plurality of openings through a thickness of the conductive body between the first surface and the second surface. In an embodiment, the housing further comprises a channel into the first surface of the conductive body, and a cover over the channel. In an embodiment, a first stem over the cover extends away from the first surface, and a second stem over the cover extends away from the first surface. In an embodiment, the first stem and the second stem open into the channel.

15 Claims, 10 Drawing Sheets

(58) Field of Classification Search
USPC .......... 219/710, 392, 390, 405, 411, 121.39,
219/121.41, 121.43, 121.48, 121.52,
219/121.58, 444.1; 156/345.47, 345.51;
118/723 R, 723 I, 723 MW, 724–729
See application file for complete search history.

(56) References Cited

U.S. PATENT DOCUMENTS

2018/0323043 A1    11/2018  Kraus et al.
2021/0098231 A1*  4/2021  Carducci .......... C23C 16/45561

FOREIGN PATENT DOCUMENTS

TW        201813453 A    4/2018
WO      2004032176 A1   4/2004

OTHER PUBLICATIONS

International Preliminary Report on Patentability for PCT/US2020/050992, dated Apr. 7, 2022, 7 pgs.
Office Action from Taiwan Patent Application No. 109132285 dated Nov. 7, 2022, 9 pgs.

* cited by examiner

MONOLITHIC MODULAR MICROWAVE SOURCE WITH INTEGRATED TEMPERATURE CONTROL

BACKGROUND

1) Field

Embodiments relate to the field of semiconductor manufacturing and, in particular, to monolithic source arrays with integrated temperature control for high-frequency sources.

2) Description of Related Art

Some high-frequency plasma sources include applicators that pass through an opening in a dielectric plate. The opening through the dielectric plate allows for the applicator (e.g., a dielectric cavity resonator) to be exposed to the plasma environment. However, it has been shown that plasma is also generated in the opening in the dielectric plate in the space surrounding the applicator. This has the potential of generating plasma non-uniformities within the processing chamber. Furthermore, exposing the applicator to the plasma environment may lead to a more rapid degradation of the applicator.

In some embodiments, the applicators are positioned over the dielectric plate or within a cavity into (but not through) the dielectric plate. Such configurations have reduced coupling with the interior of the chamber and, therefore, does not provide an optimum plasma generation. The coupling of the high-frequency electromagnetic radiation with the interior of the chamber is diminished in part due to the additional interface between the dielectric plate and the applicator across which the high-frequency electromagnetic radiation needs to propagate. Additionally, variations of the interface (e.g., positioning of the applicator, surface roughness of the applicator and/or the dielectric plate, angle of the applicator relative to the dielectric plate, etc.) at each applicator and across different processing tools may result in plasma non-uniformities.

Particularly, when the applicators are discrete components from the dielectric plate, plasma non-uniformity (within a single processing chamber and/or across different processing chambers (e.g., chamber matching)) is more likely to occur. For example, with discrete components, small variations (e.g., variations in assembly, machining tolerances, etc.) can result in plasma non-uniformities that negatively affect processing conditions within the chamber.

SUMMARY

Embodiments disclosed herein include a housing for a source assembly. In an embodiment, the housing comprises a conductive body with a first surface and a second surface opposite from the first surface, and a plurality of openings through a thickness of the conductive body between the first surface and the second surface. In an embodiment, the housing further comprises a channel into the first surface of the conductive body, and a cover over the channel. In an embodiment, a first stem over the cover extends away from the first surface, and a second stem over the cover extends away from the first surface. In an embodiment, the first stem and the second stem open into the channel.

Embodiments may also include an assembly for a processing tool. In an embodiment, the assembly comprises a monolithic source array and a housing. In an embodiment, the monolithic source array comprises a dielectric plate having a first surface and a second surface, and a plurality of protrusions extending out from the first surface of the dielectric plate. In an embodiment, the housing comprises a conductive body having a third surface and a fourth surface, and a plurality of openings through the conductive body. In an embodiment, each of the protrusions is within a different one of the openings. The housing may also comprise a channel into the third surface, and a cover over the channel, the cover comprising a first stem and a second stem.

Embodiments disclosed herein may also comprise a processing tool. In an embodiment, the processing tool comprises a chamber and an assembly interfacing with the chamber. In an embodiment, the assembly comprises a monolithic source array, a housing over and around the monolithic source array. In an embodiment, the housing comprises a channel that is sealed by a cover.

DETAILED DESCRIPTION

Figure 1:
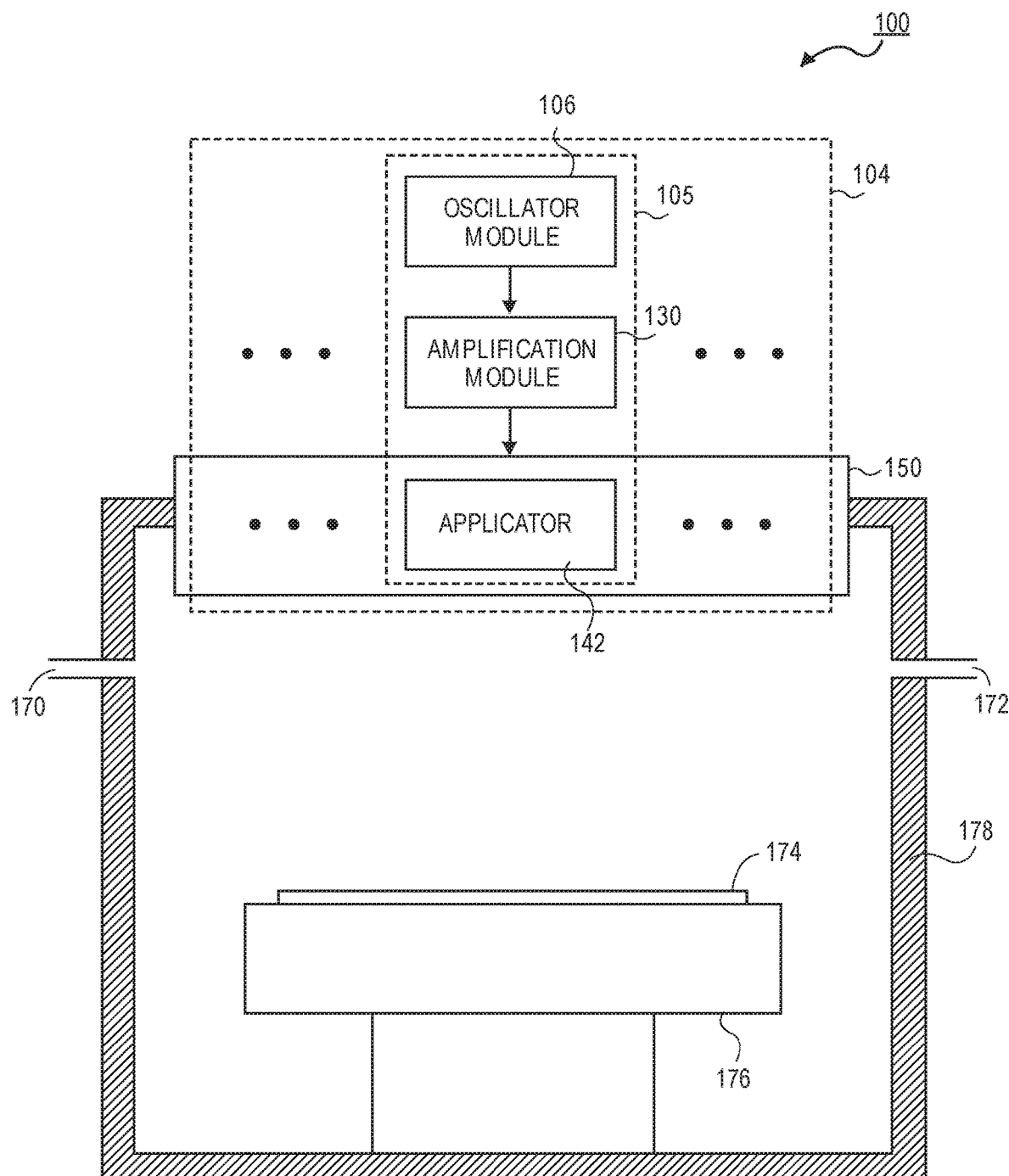
FIG. 1 is a schematic illustration of a processing tool that comprises a modular high-frequency emission source with a monolithic source array that comprises a plurality of applicators, in accordance with an embodiment.

Systems described herein include monolithic source arrays with integrated temperature control for high-frequency sources. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, high-frequency plasma sources with discrete applicators may result in plasma non-uniformities within a chamber and in non-optimum injection of the high-frequency electromagnetic radiation into the chamber. The non-uniformities in the plasma may arise for different reasons, such as assembly issues, manufacturing tolerances, degradation, and the like. The non-optimum injection of the high-frequency electromagnetic radiation into the chamber may result (in part) from the interface between the applicator and the dielectric plate.

Accordingly, embodiments disclosed herein include a monolithic source array. In an embodiment, the monolithic source array comprises a dielectric plate and a plurality of protrusions that extend up from a surface of the dielectric plate. Particularly, the protrusions and the dielectric plate form a monolithic part. That is, the protrusions and the dielectric plate are fabricated from a single block of material. The protrusions have dimensions suitable for being used as the applicators. For example, holes into the protrusions may be fabricated that accommodate a monopole antenna. The protrusions may, therefore, function as a dielectric cavity resonator.

Implementing the source array as a monolithic part has several advantages. One benefit is that tight machining tolerances may be maintained in order to provide a high degree of uniformity between parts. Whereas discrete applicators need assembly, the monolithic source array avoids possible assembly variations. Additionally, the use of a monolithic source array provides improved injection of high-frequency electromagnetic radiation into the chamber, because there is no longer a physical interface between the applicator and the dielectric plate.

Monolithic source arrays also provide improved plasma uniformity in the chamber. Particularly, the surface of the dielectric plate that is exposed to the plasma does not include any gaps to accommodate the applicators. Furthermore, the lack of a physical interface between the protrusions and the dielectric plate improves lateral electric field spreading in the dielectric plate.

For many applications, temperature uniformity of the workpiece is another requirement in addition to plasma uniformities. Without adequate temperature control, processing outcomes may not be able to meet specifications. For some applications, the surface of the plasma source is directly over the workpiece with only a small gap (e.g., approximately 5 cm or less) separating the two surfaces. Such small gaps facilitate heat transfer (i.e., radiation and convection) from the workpiece to the source, or from the source to the workpiece. The ability to provide a uniform temperature at the surface of the source is therefore very beneficial. Temperature uniformity is particularly critical for certain processing operations, such as atomic layer deposition (ALD), chemical vapor deposition (CVD), and plasma treatments, to name a few.

Accordingly, embodiments disclosed herein include a monolithic source array with integrated temperature control. In some embodiments, a housing that surrounds protrusions of the monolithic source array comprises a plurality of channels for routing thermal fluid through the conductive body of the housing. Embodiments may also include an embedded heater. As such, the temperature of the monolithic source array may be increased or decreased.

Referring now to FIG. 1, a cross-sectional illustration of a plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning. Additional embodiments may include a processing tool 100 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that gas may also be injected into the chamber 178 through a monolithic source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the monolithic source array 150. However, it is to be appreciated that the monolithic source array 150 may be a monolithic structure that comprises one or more portions of the applicator 142 (e.g., a dielectric resonating body) and a dielectric plate that faces the interior of the chamber 178.

In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the processing gasses in the chamber 178 to produce a plasma.

Figure 2:
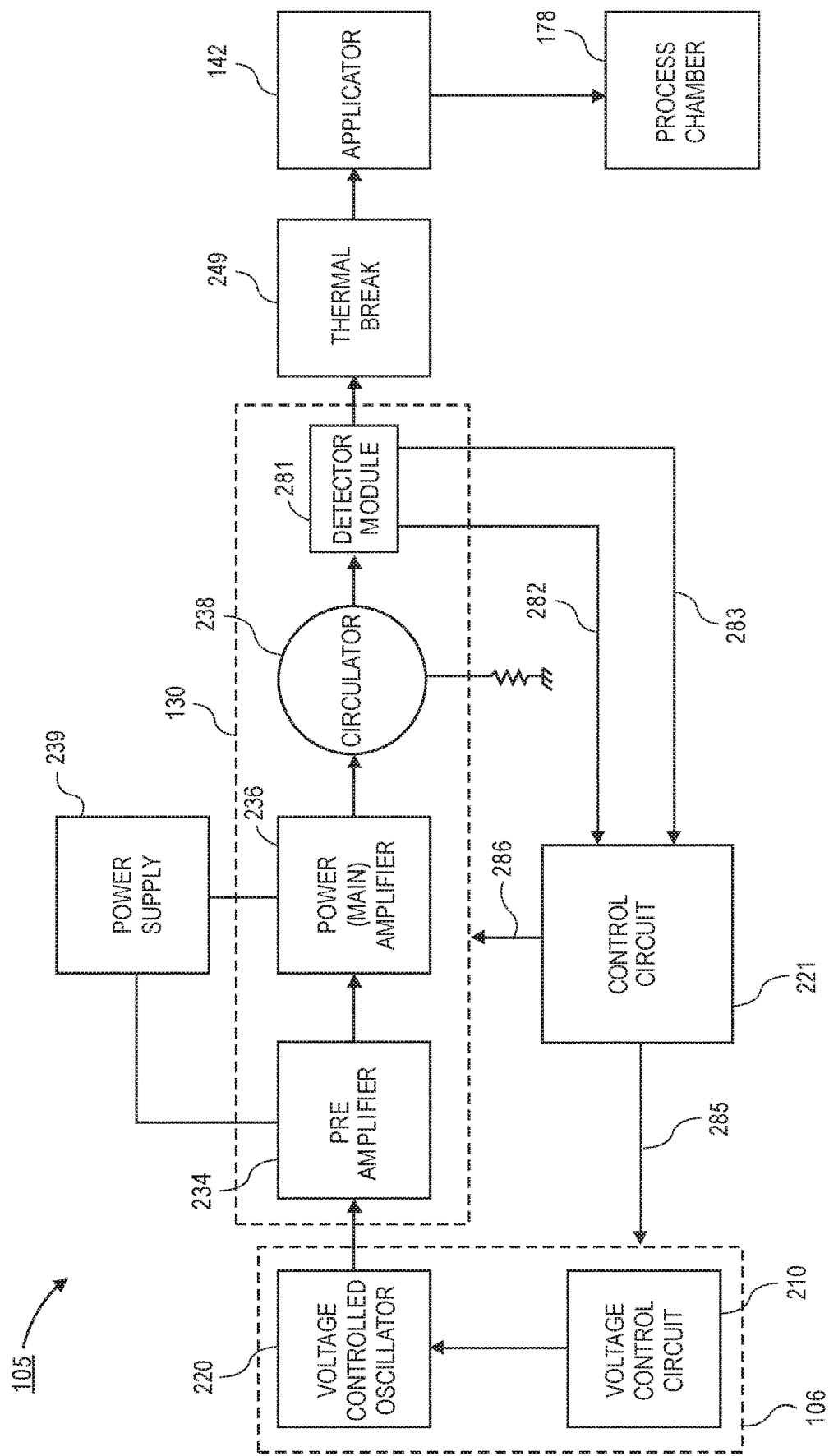
FIG. 2 is a block diagram of a modular high-frequency emission module, in accordance with an embodiment.

Referring now to FIG. 2, a schematic of a solid state high-frequency emission module 105 is shown, in accordance with an embodiment. In an embodiment, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system (e.g., between the circulator 238 and the thermal break 249). In an embodiment, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In an embodiment, control signal 285 adjusts the oscillator module 106 to optimize the high-frequency radiation coupled to the amplification module 130. In an embodiment, control signal 286 adjusts the amplification module 130 to optimize the output power coupled to the applicator 142 through the thermal break 249. In an embodiment, the feedback control of the oscillator module 106 and the amplification module 130, in addition to the tailoring of the impedance matching in the thermal break 249 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3:
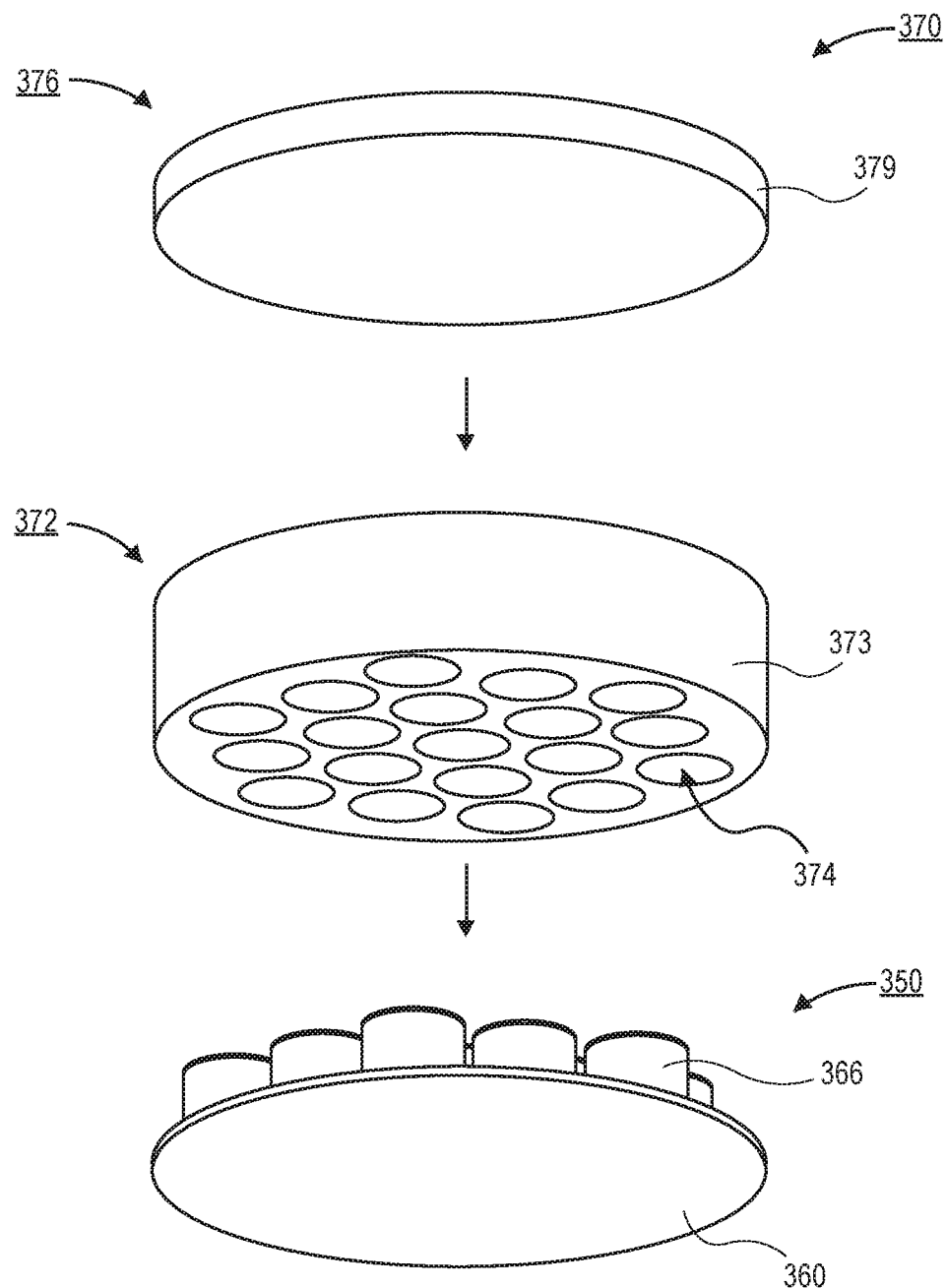
FIG. 3 is an exploded perspective view illustration of an assembly, in accordance with an embodiment.

Referring now to FIG. 3, an exploded perspective view illustration of an assembly 370 is shown, in accordance with an embodiment. In an embodiment, the assembly 370 comprises a monolithic source array 350, a housing 372, and a lid plate 376. As indicated by the arrows, the housing 372 fits over and around the monolithic source array 350, and the lid plate 376 covers the housing 372. In the illustrated embodiment, the assembly 370 is shown as having a substantially circular shape. However, it is to be appreciated that the assembly 370 may have any desired shape (e.g., polygonal, elliptical, wedge shaped, or the like).

In an embodiment, the monolithic source array 350 may comprise a dielectric plate 360 and a plurality of protrusions 366 that extend up from the dielectric plate 360. In an embodiment, the dielectric plate 360 and the plurality of protrusions 366 are a monolithic structure. That is, there is no physical interface between a bottom of the protrusions 366 and the dielectric plate 360. As used herein, a "physical interface" refers to a first surface of a first discrete body contacting a second surface of a second discrete body.

Each of the protrusions 366 are a portion of the applicator 142 used to inject high-frequency electromagnetic radiation into a processing chamber 178. Particularly, the protrusions 366 function as the dielectric cavity resonator of the applicator 142. In an embodiment, the monolithic source array 350 comprises a dielectric material. For example, the monolithic source array 350 may be a ceramic material. In an embodiment, one suitable ceramic material that may be used for the monolithic source array 350 is $Al_2O_3$. The monolithic structure may be fabricated from a single block of material. In other embodiments, a rough shape of the monolithic source array 350 may be formed with a molding process, and subsequently machined to provide the final structure with the desired dimensions. For example, green state machining and firing may be used to provide the desired shape of the monolithic source array 350. In the illustrated embodiment, the protrusions 366 are shown as having a circular cross-section (when viewed along a plane parallel to the dielectric plate 360). However, it is to be appreciated that the protrusions 366 may comprise many different cross-sections. For example, the cross-section of the protrusions 366 may have any shape that is centrally symmetric.

In an embodiment, the housing 372 comprises a conductive body 373. For example, the conductive body 373 may be aluminum or the like. The housing comprises a plurality of openings 374. The openings 374 may pass entirely through a thickness of the conductive body 373. The openings 374 may be sized to receive the protrusions 366. For example, as the housing 372 is displaced towards the monolithic source array 350 (as indicated by the arrow) the protrusions 366 will be inserted into the openings 374. In an embodiment, the openings 374 may have a diameter that is approximately 15 mm or greater.

In the illustrated embodiment, the housing 372 is shown as a single conductive body 373. However, it is to be appreciated that the housing 372 may comprise one or more discrete conductive components. The discrete components may be individually grounded, or the discrete components may be joined mechanically or by any form of metallic bonding, to form a single electrically conductive body 373.

In an embodiment, the lid plate 376 may comprise a conductive body 379. In an embodiment, the conductive body 379 is formed from the same material as the conductive body 373 of the housing 372. For example, the lid plate 376 may comprise aluminum. In an embodiment, the lid plate 376 may be secured to the housing 372 using any suitable fastening mechanism. For example, the lid plate 376 may be secured to the housing 372 with bolts or the like. In some embodiments, the lid plate 376 and the housing 372 may also be implemented as a single monolithic structure. In an embodiment, the lid plate 376 and the housing are both electrically grounded during operation of the processing tool.

Figure 4A:
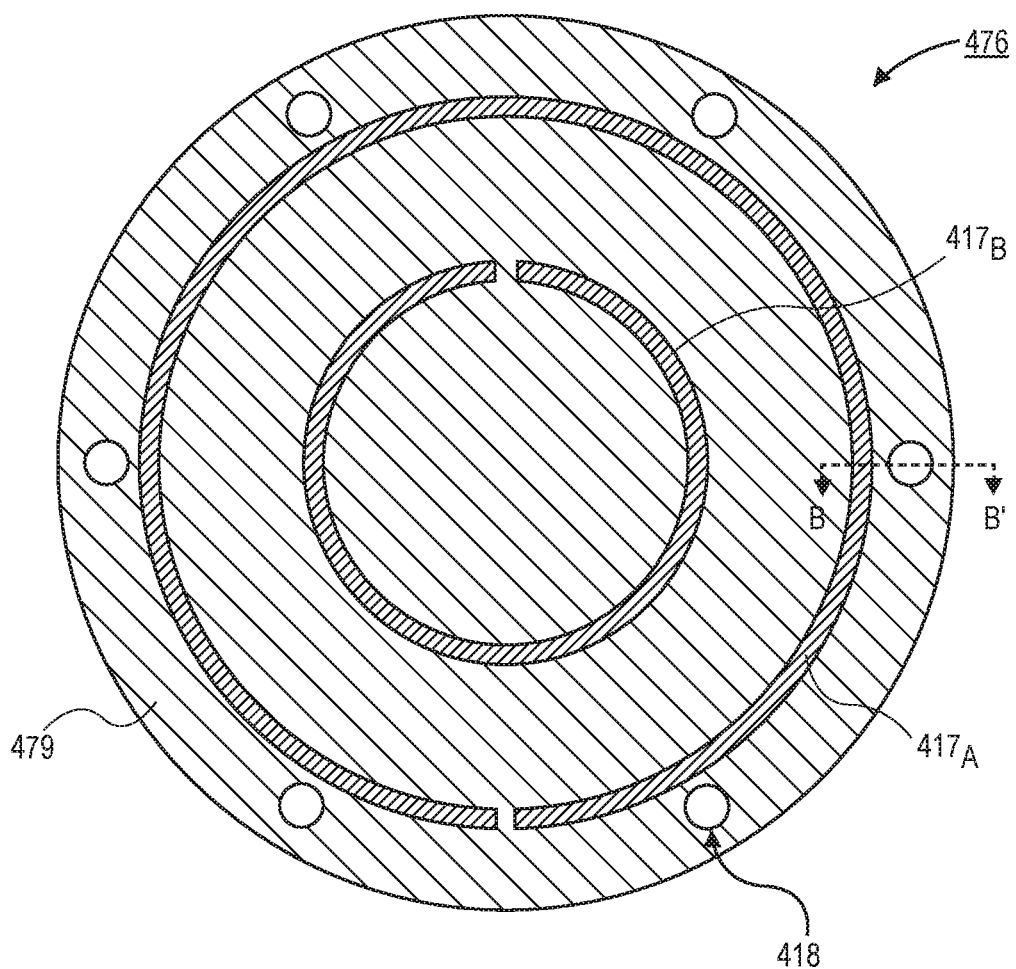
FIG. 4A is a plan view illustration of a lid plate with embedded heating elements, in accordance with an embodiment.
Figure 4B:
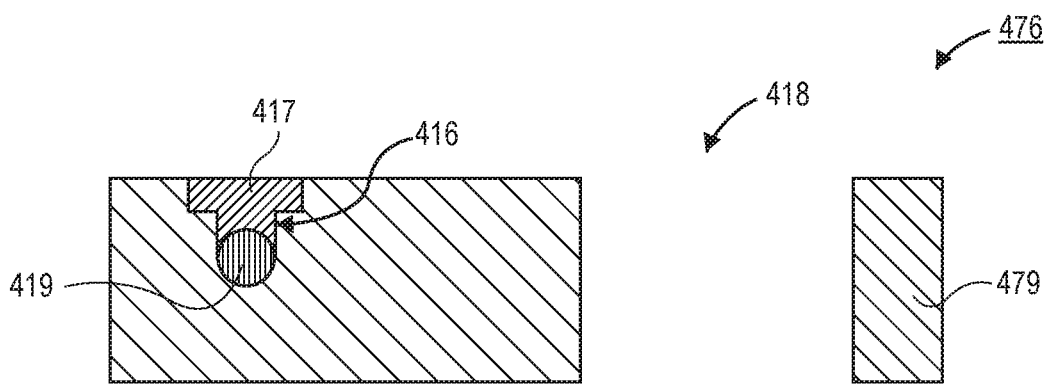
FIG. 4B is a cross-sectional illustration of the lid plate in FIG. 4A along line B-B', in accordance with an embodiment.

Referring now to FIGS. 4A and 4B, more detailed plan view and cross-sectional view illustrations of the lid plate 476 are shown, respectively, in accordance with an embodiment. In an embodiment, the lid plate 476 comprises a conductive body 479. The conductive body 479 may comprise one or more trenches 416 to accommodate heating elements 419. For example, the heating elements 419 may be resistive heating elements. The heating elements 419 may be covered by a cover 417. In an embodiment, the cover 417 may comprise any suitable material. For example, the cover 717 may be a rigid material. In an embodiment, the cover 717 may be an epoxy or glue that is dispensed over the heating elements 417.

In the illustrated embodiment, a pair of heating elements 419 are shown. A first heating element 419 covered by cover $417_A$ is proximate to a perimeter of the lid plate 476, and a second heating element 419 covered by cover $417_B$ is proximate to an axial center of the lid plate 476. The pair of heating elements 419 provide temperature control for an outer region and an inner region of the assembly. Accordingly, more precise temperature control to correct non-uniformities across the surface of the workpiece is possible. While a pair or ring shaped heating elements are shown, it is to be appreciated that embodiments include any number of heating elements 419 (e.g., one or more) and in any configuration. For example, the heating elements 419 may be arranged in a serpentine pattern, a spiral pattern, or any other suitable pattern.

In an embodiment, the lid plate 476 may comprise one or more holes 418. The holes 418 may pass through an entire thickness of the conductive body 479. In an embodiment, the holes 418 are positioned to accommodate stems (not shown) extending up from a thermal fluid channel in the housing. The stems and the thermal fluid channel are described in greater detail below. In an embodiment, six holes 418 are shown. The six holes 418 may accommodate three separate thermal fluid channels (i.e., to provide an inlet and an outlet for each channel). However, it is to be appreciated that any number of holes 418 may be used to accommodate different numbers of thermal fluid channel loops.

Figure 5A:
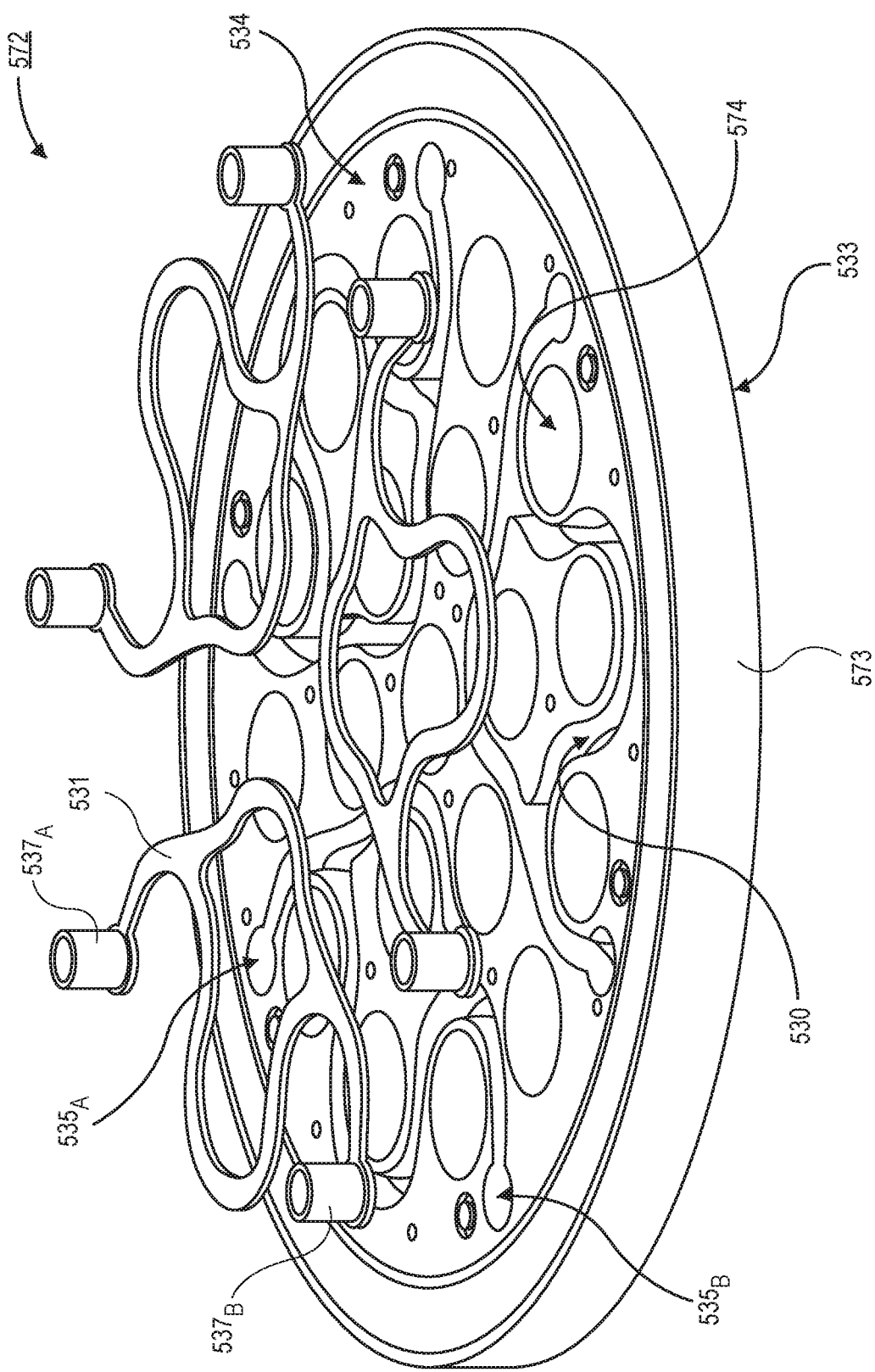
FIG. 5A is an exploded perspective view illustration of a housing, in accordance with an embodiment.

Referring now to FIG. 5A, an exploded perspective view illustration of the housing 572 is shown, in accordance with an embodiment. The illustrated embodiment depicts a first surface 534 of the housing 572. The first surface 534 is the surface that faces towards the lid plate 476, and a second surface 533 faces towards the monolithic source array. As shown, the housing 572 comprises a conductive body 573 with a plurality of openings 574. In the illustration, the conductive body 573 is shown as one part and a plurality of covers 531 are raised up off the first surface 534 in order to illustrate the thermal fluid channels 530 (also referred to as simply "channels") into the first surface 534. The channels 530 extend into the conductive body 573 but do not pass entirely through the thickness of the conductive body 573. Furthermore, it is to be appreciated that the openings 574 and the channels 530 are not fluidically coupled to each other. That is, during operation thermal fluid that is flown through the channels 530, and thermal fluid may not pass through the openings 574.

As shown, the channels 530 have a first end $535_A$ and a second end $535_B$. The length of the channel 530 between the first end $535_A$ and the second end $535_B$ may be routed between the openings 574 through the conductive body 573. For example, each of the channels 530 may encircle one or more of the openings 574. In the illustrated embodiment, the channels 530 encircle a pair of openings 574. In an embodiment, each of the channels 530 may have substantially the same shape. For example, each of the three channels 530 in FIG. 5A are substantially uniform in shape. However, other embodiments may include channels 530 that have non-uniform shapes.

In an embodiment, the covers 531 may include a first stem $537_A$ and a second stem $537_B$. The first stem $537_A$ is positioned over the first end $535_A$ of the channel 530, and the second stem $537_B$ is positioned over the second end $535_B$ of the channel 530. The stems 535 provide an inlet and an outlet into/out of the channel 530. Accordingly, thermal fluid (e.g., coolant, etc.) may be flown through the channel 530 in order to regulate the temperature of the housing 572. In an embodiment, the stems 535 pass through the holes 418 in the lid plate 476.

Figure 5B:
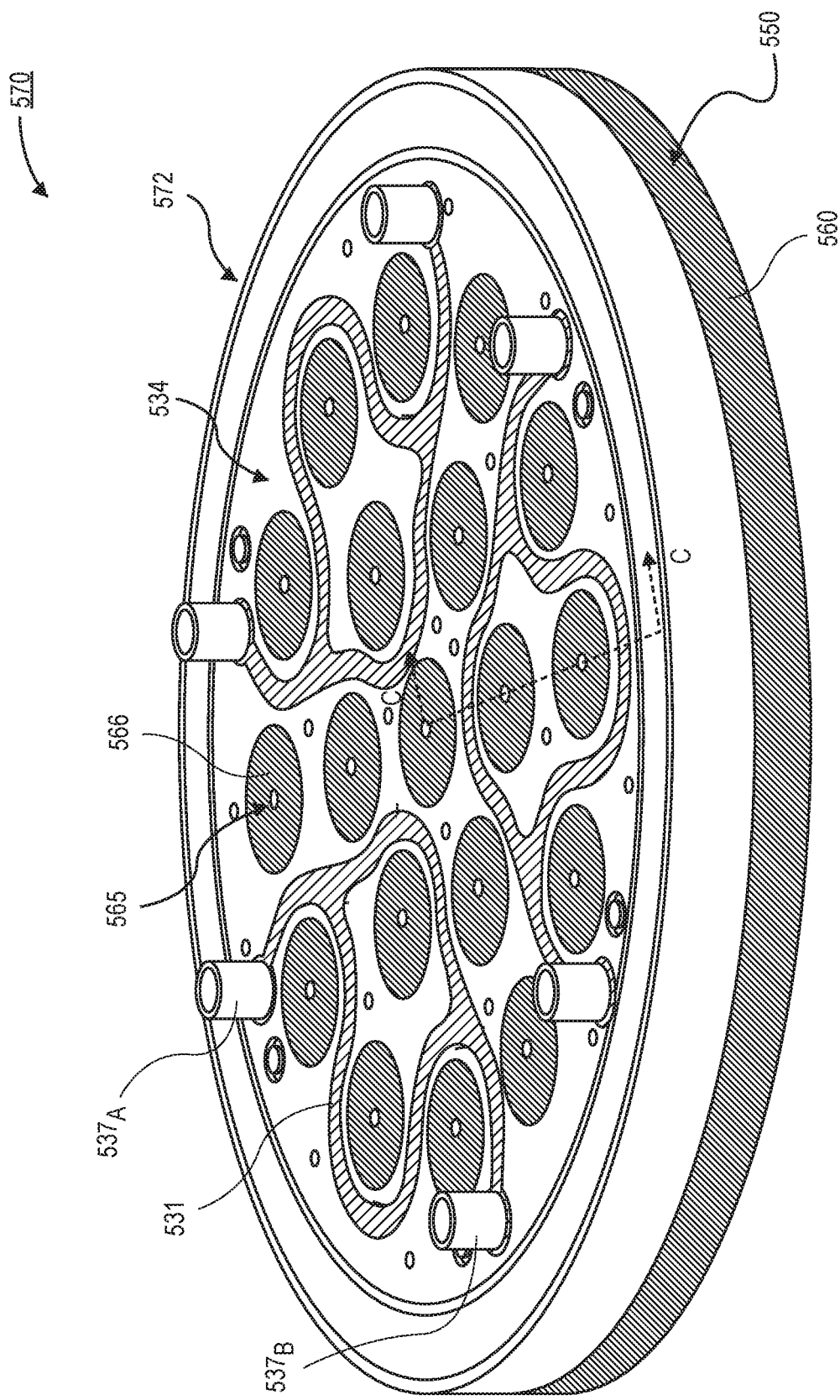
FIG. 5B is a perspective view illustration of a portion of an assembly, in accordance with an embodiment.

Referring now to FIG. 5B, a perspective view illustration of a portion of the assembly 570 is shown, in accordance with an embodiment. The illustrated assembly 570 comprises a monolithic source array 550 and a housing 572 over and around the monolithic source array 550. The dielectric plate 560 is below the housing 572 and the protrusions 566 extend up through the housing 572. The protrusions 566 include holes 565 at their axial center. The holes 565 are sized to accommodate a monopole antenna (not shown). In FIG. 5B the covers 531 have been placed over the channels 530. In an embodiment, the covers 531 are welded to the housing 572. The stems 537 extend up from the cover 531 away from the first surface 534.

Figure 5C:
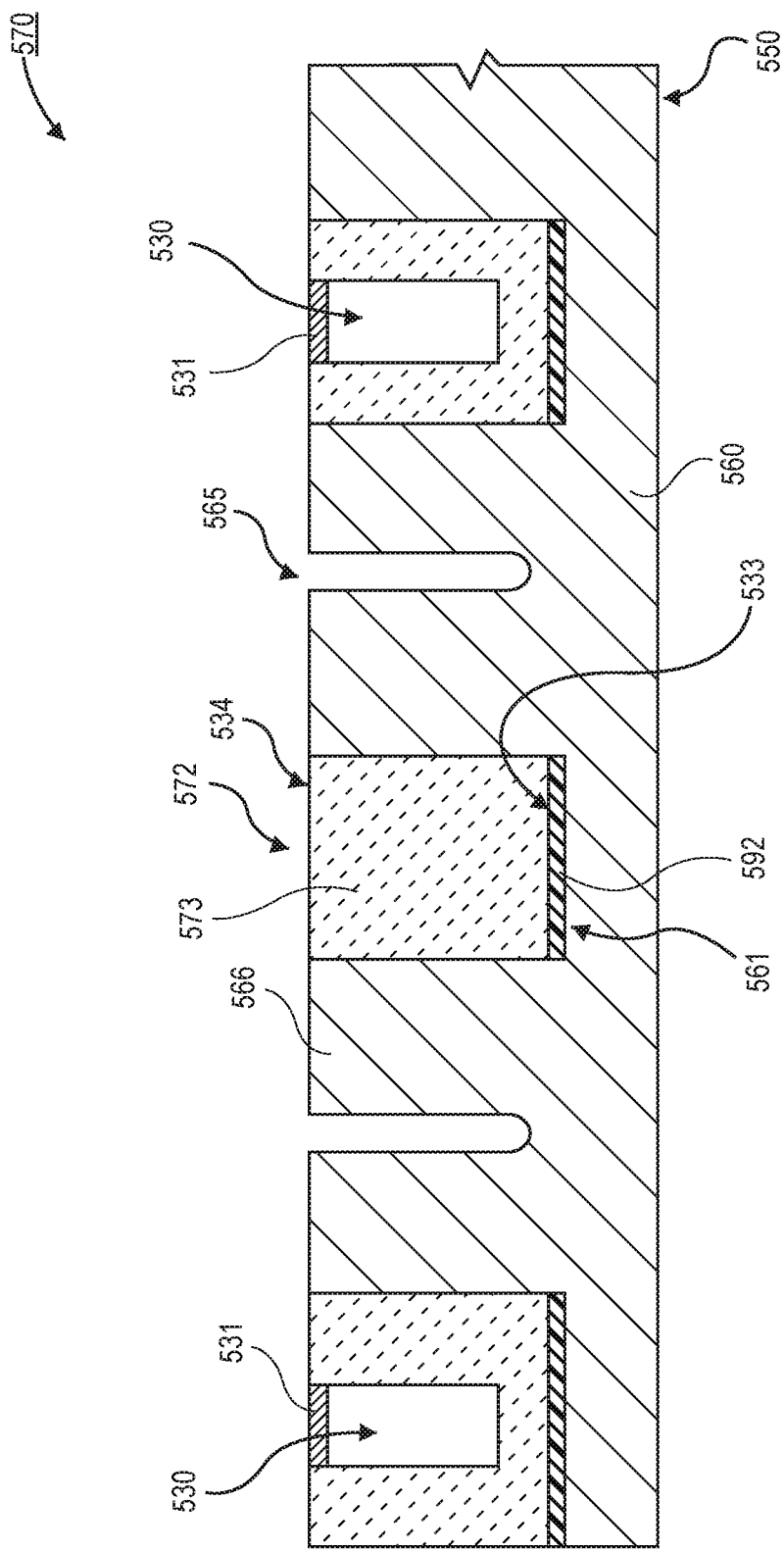
FIG. 5C is a cross-sectional illustration of the assembly in FIG. 5B along line C-C', in accordance with an embodiment.

Referring now to FIG. 5C, a cross-sectional illustration of the assembly 570 in FIG. 5B along line C-C' is shown, in accordance with an embodiment. The cross-sectional illustration more clearly depicts the channels 530 and the covers 531. The channels 530 extend into and out of the plane of the cross-section in order to connect together and form a loop around the protrusions 566. In an embodiment, the channels 530 are formed into the first surface 534, but do not extend entirely through a thickness of the conductive body 573.

In an embodiment, the housing 572 may be supported by the first surface 561 of the dielectric plate 560. In some embodiments, a thermal interface material 592 may be provided at the interface of the first surface 561 of the dielectric plate 560 and the second surface 533 of the housing 572. For example, the thermal interface material 592 may be a thermal gasket or the like. The use of a thermal interface material 592 improves the heat transfer between the housing 572 and the monolithic source array 550. In an embodiment, the thermal interface material 592 may be a single continuous layer, or the thermal interface material 592 may comprise a plurality of discrete pads across the interface.

Figure 6:
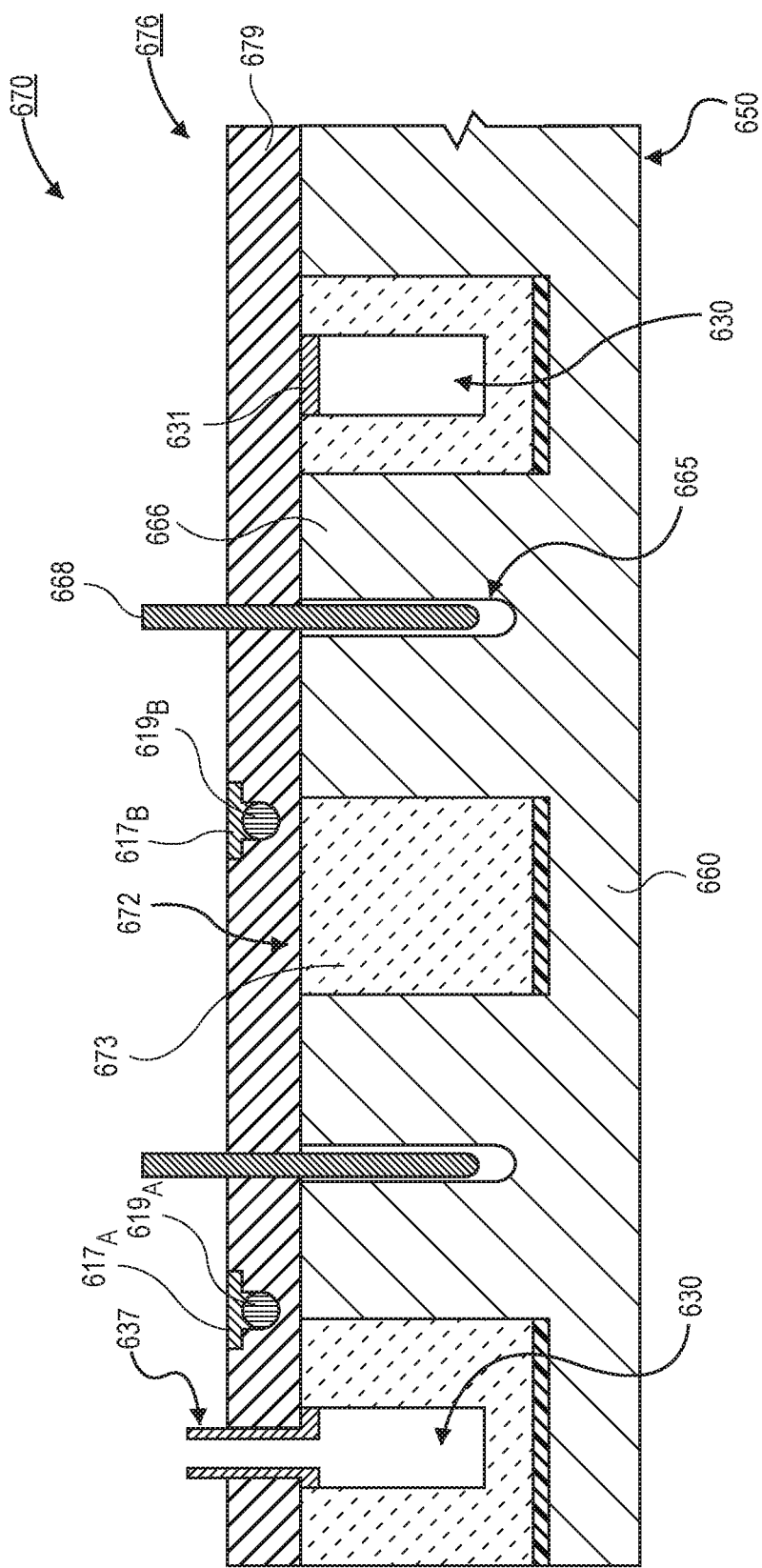
FIG. 6 is a cross-sectional illustration of an assembly, in accordance with an embodiment.

Referring now to FIG. 6, a cross-sectional illustration of an assembly 670 is shown in accordance with an embodiment. The illustrated embodiment depicts the monolithic source array 650, the housing 672, and the lid plate 676. In an embodiment, the housing 676 is supported by the dielectric plate 660 and wraps around the protrusions 666. The conductive body 673 of the housing 672 comprises a channel 630 that is sealed by a cover 631. The lid plate 676 rests over the housing 672 and the protrusions 666. In an embodiment, a monopole antenna 668 may pass through the lid plate 676 and fit into a hole 665 into the protrusion 666 below the lid plate 676.

In an embodiment, a stem 637 passes through the conductive body 679 of the lid plate 676. The stem 637 may be fluidically coupled to a source of thermal fluid (not shown). A second stem 637 (out of the plane of FIG. 6) may be an outlet for the thermal fluid. In an embodiment, the lid plate 676 may comprise one or more heating elements 619. For example, an outer heating element 619$_A$ and an inner heating element 619$_B$ are shown in trenches into conductive body 679. The heating elements 619 may be covered by covers 617$_A$, 617$_B$.

Figure 7:
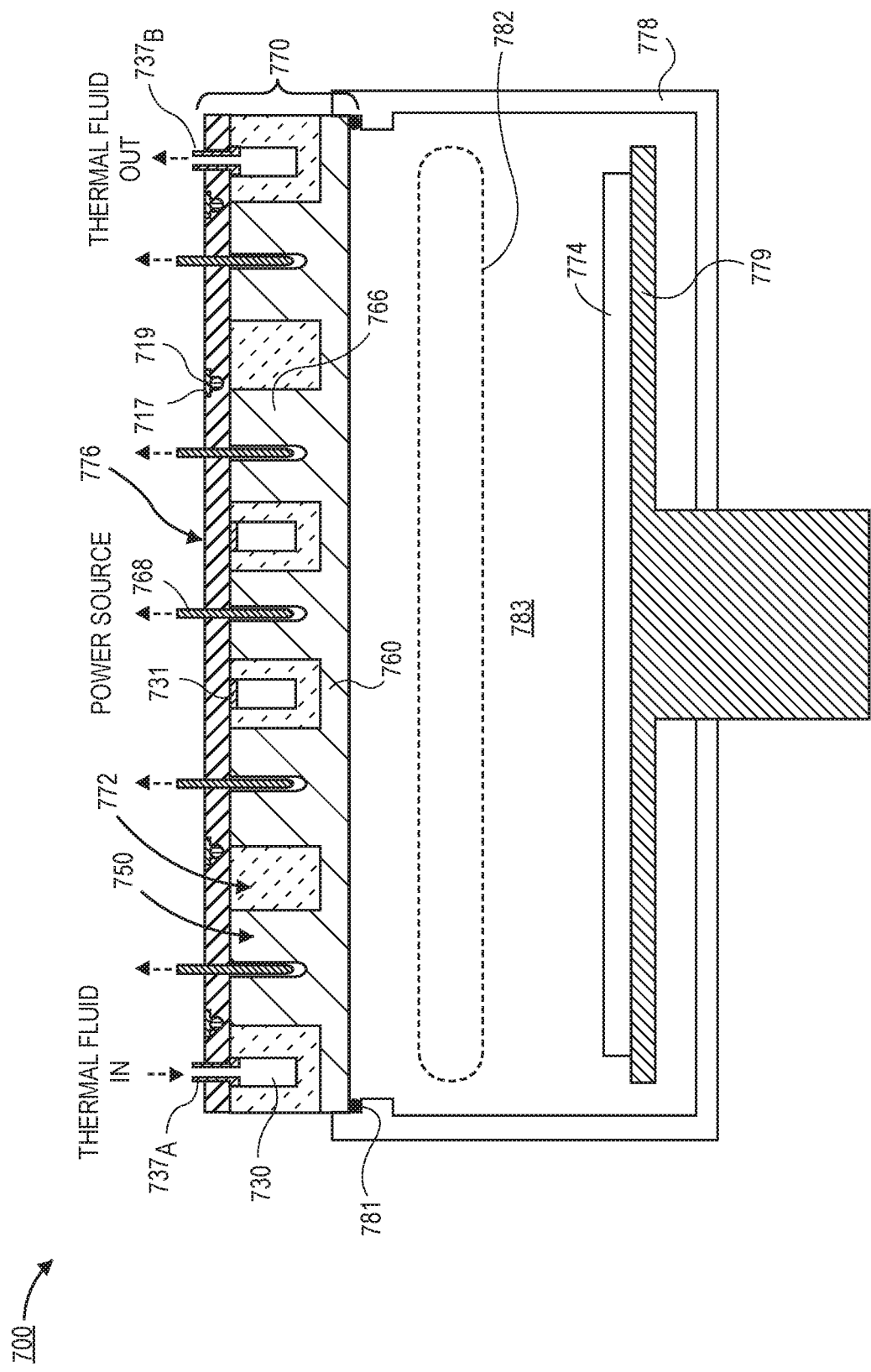
FIG. 7 is a cross-sectional illustration of a processing tool with an assembly that comprises integrated temperature control, in accordance with an embodiment.

Referring now to FIG. 7, a cross-sectional illustration of a processing tool 700 that includes an assembly 770 is shown, in accordance with an embodiment. In an embodiment, the processing tool comprises a chamber 778 that is sealed by an assembly 770. For example, the assembly 770 may rest against one or more O-rings 781 to provide a vacuum seal to an interior volume 783 of the chamber 778. In other embodiments, the assembly 770 may interface with the chamber 778. That is, the assembly 770 may be part of a lid that seals the chamber 778. In an embodiment, the processing tool 700 may comprise a plurality of processing volumes (which may be fluidically coupled together), with each processing volume having a different assembly 770. In an embodiment, a chuck 779 or the like may support a workpiece 774 (e.g., wafer, substrate, etc.). In an embodiment, the chamber volume 783 may be suitable for striking a plasma 782. That is, the chamber 778 may be a vacuum chamber.

In an embodiment, the assembly 770 may be substantially similar to the assemblies 670 described above. For example, the assembly 770 comprises a monolithic source array 750, a housing 772, and a lid plate 776. The monolithic source array 750 may comprise a dielectric plate 760 and a plurality of protrusions 766 extending up from the dielectric plate 760. The housing 772 may having openings sized to receive the protrusions 766. In an embodiment, monopole antennas 768 may extend into holes in the protrusions 766. The monopole antennas 768 may pass through a lid plate 776 over the housing 772 and the protrusions 766. The monopole antennas 768 are each electrically coupled to power sources (e.g., high-frequency emission modules 105).

In an embodiment, the assembly 770 may comprise an integrated temperature control system. In some embodiments, the assembly 770 includes a cooling system and/or a heating system. Particularly, the temperature of the surface of the dielectric plate 760 that faces the workpiece may be controlled by the assembly. One way to control the temperature of the dielectric plate 760 is to flow a thermal fluid through channels 730 in the housing 772. The channels 730 may be have an input stem 737$_A$ and an output stem 737$_B$.

The stems 737 may pass through a thickness of the lid plate 776. In an embodiment, the channels 730 may be sealed by a cover 731.

In an embodiment, a second avenue for temperature control is with a heating element 719. In an embodiment, one or more heating elements 719 may be embedded in the lid plate 776. The heating elements 719 may be covered by a cover 717. In the illustrated embodiment, a pair or ring heating elements 719 are shown, though any number and configuration of heating elements 719 may be used.

Figure 8:
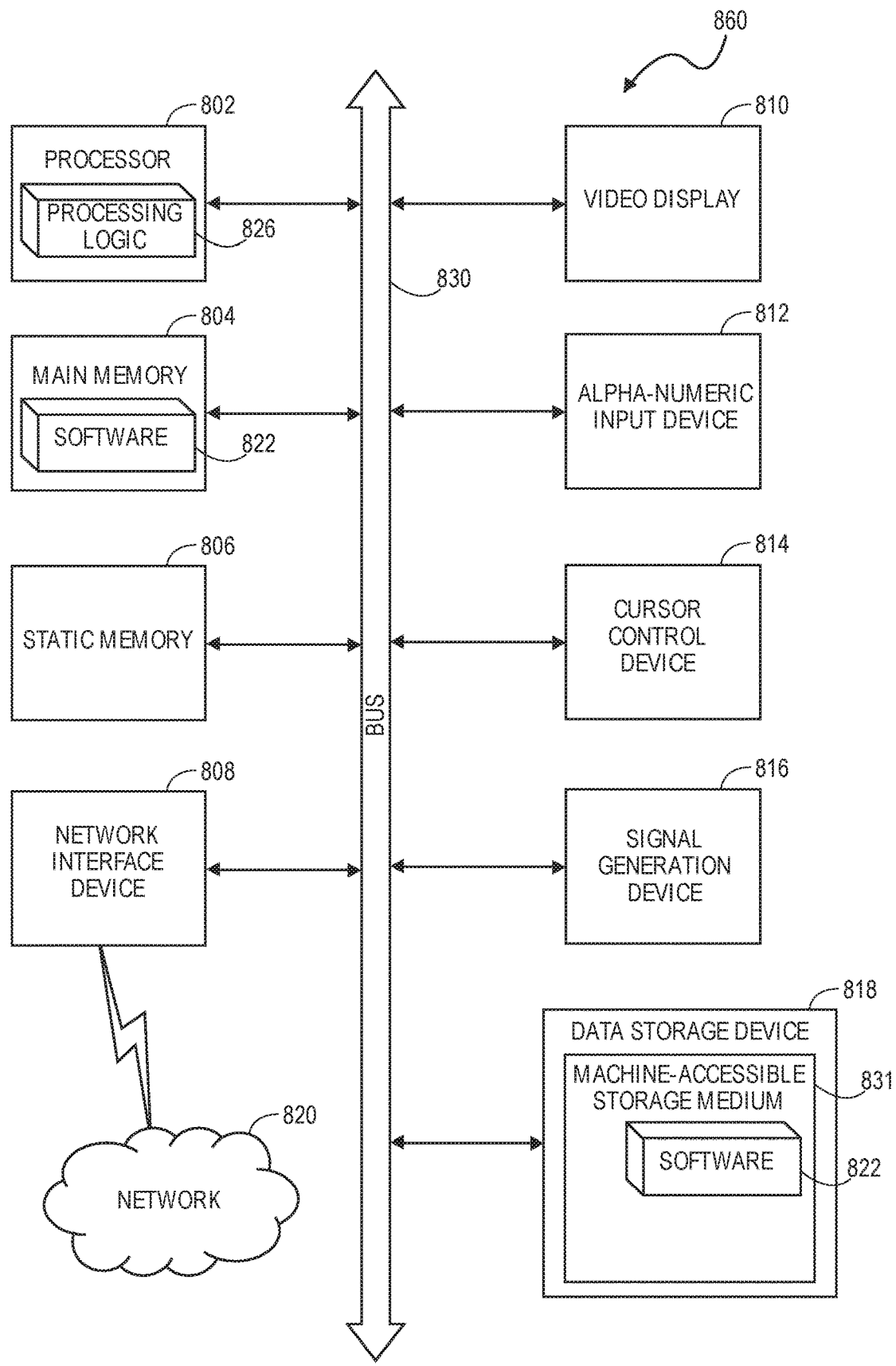
FIG. 8 illustrates a block diagram of an exemplary computer system that may be used in conjunction with a high-frequency plasma tool, in accordance with an embodiment.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A housing, comprising:
   a conductive body with a first surface and a second surface opposite from the first surface;
   a plurality of openings through a thickness of the conductive body between the first surface and the second surface;
   a channel into the first surface of the conductive body;
   a cover over the channel;
   a first stem over the cover and extending away from the first surface, wherein the first stem opens into the channel; and
   a second stem over the cover and extending away from the first surface, wherein the second stem opens into the channel, wherein the first stem is at a first end of the cover and the second stem is at a second end of the cover.

2. The housing of claim 1, wherein the channel encircles at least one of the plurality of openings.

3. The housing of claim 1, wherein a diameter of each of the openings is approximately 15 mm or greater.

4. The housing of claim 1, further comprising:
   a lid plate over the first surface of the conductive body.

5. The housing of claim 4, wherein the lid plate comprises:
   a first hole through a thickness of the lid plate; and
   a second hole through a thickness of the lid plate.

6. The housing of claim 5, wherein the first stem extends through the first hole, and wherein the second stem extends through the second hole.

7. The housing of claim 4, wherein the lid plate comprises:
   a heating element.

8. The housing of claim 7, wherein the heating element is buried in a trench into a first surface of the lid plate that faces away from the conductive body.

9. The housing of claim 1, further comprising:
   a plurality of channels; and
   a plurality of covers, wherein each cover is over a different one of the channels.

10. An assembly, comprising:
    a monolithic source array, comprising:
        a dielectric plate having a first surface and a second surface;
        a plurality of protrusions extending out from the first surface of the dielectric plate; and
    a housing, comprising:
        a conductive body having a third surface and a fourth surface;
        a plurality of openings through the conductive body, wherein each of the protrusions is within a different one of the openings;
        a channel into the third surface; and
        a cover over the channel, the cover comprising a first stem and a second stem, wherein the first stem is at a first end of the cover and the second stem is at a second end of the cover.

11. The assembly of claim 10, further comprising a lid plate over the housing, wherein the lid plate comprises:
    a first hole and a second hole, wherein the first stem passes through the first hole and the second stem passes through the second hole; and
    a heating element wherein the heating element is in a trench into a surface of the lid plate that faces away from the housing.

12. The assembly of claim 11, further comprising:
    a plurality of heating elements in the lid plate.

13. The assembly of claim 10, further comprising:
    a plurality of channels into the third surface of the conductive body.

14. The assembly of claim 10, further comprising:
    a thermal interface material between the first surface of the dielectric plate and the fourth surface of the conductive body.

15. The assembly of claim 10, further comprising:
    a plurality of monopole antennas, wherein each monopole antenna is within a different hole in an axial center of different ones of the protrusions.

\* \* \* \* \*